(12) United States Patent
Kim (10) Patent No.: US 7,884,350 B2
(45) Date of Patent: Feb. 8, 2011

(54) SEMICONDUCTOR LIGHT EMITTING DEVICE AND METHOD FOR MANUFACTURING THE SAME

(75) Inventor: Kyung Jun Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 49 days.

(21) Appl. No.: 12/247,870

(22) Filed: Oct. 8, 2008

(65) Prior Publication Data
US 2009/0090901 A1    Apr. 9, 2009

(30) Foreign Application Priority Data
Oct. 8, 2007    (KR) .................. 10-2007-0100980

(51) Int. Cl.
*H01L 29/06* (2006.01)
(52) U.S. Cl. .................... 257/13; 257/79; 257/94; 257/E33.001; 438/22
(58) Field of Classification Search .............. 257/12, 257/79, 94, E33.001; 438/22
See application file for complete search history.

(56) References Cited

U.S. PATENT DOCUMENTS

| 2002/0054616 | A1* | 5/2002 | Kamiyama et al. ............ 372/45 |
| 2003/0118066 | A1* | 6/2003 | Bour et al. ..................... 372/45 |
| 2004/0256611 | A1* | 12/2004 | Kim et al. ..................... 257/13 |
| 2007/0045607 | A1* | 3/2007 | Chen et al. .................... 257/14 |

\* cited by examiner

*Primary Examiner*—Bradley K Smith
*Assistant Examiner*—Jami M Valentine
(74) *Attorney, Agent, or Firm*—Birch, Stewart, Kolasch & Birch, LLP

(57) ABSTRACT

Disclosed is a semiconductor light emitting device. The semiconductor light emitting device comprises a first conductive semiconductor layer, a lower super lattice layer under the first conductive semiconductor layer, an active layer on the first conductive semiconductor layer, a second conductive super lattice layer on the active layer, and a second conductive semiconductor layer on the second conductive super lattice layer.

20 Claims, 11 Drawing Sheets

SEMICONDUCTOR LIGHT EMITTING DEVICE AND METHOD FOR MANUFACTURING THE SAME

The present application claims priority under 35 U.S.C. 119 to Korean Patent Application No. 10-2007-0100980 (filed on Oct. 8, 2007), which is hereby incorporated by reference in its entirety.

BACKGROUND

The present disclosure relates to a semiconductor light emitting device and a method of manufacturing the same.

Groups III-V nitride semiconductors have been variously applied to an optical device such as blue and green LEDs (Light Emitting Diodes), a high speed switching device, such as a MOSFET (Metal Semiconductor Field Effect Transistor) and an HEMT (Hetero junction Field Effect Transistors), and a light source of a lighting device or a display device.

A nitride semiconductor is mainly used for the LED or an LD (laser diode), and studies have been continuously conducted to improve the manufacturing process or the light efficiency of the nitride semiconductor.

SUMMARY

The embodiment provides a semiconductor light emitting device comprising at least one super lattice layer above and/or below an active layer, and a method of manufacturing the same.

The embodiment provides a semiconductor light emitting device capable of buffering stress transferred to an active layer by forming a plurality of super lattice layers and a plurality of buffer layers below an active layer, and a method of manufacturing the same.

The embodiment provides a semiconductor light emitting device having a substantially flat energy band by varying a composition ratio of materials constituting at least a part of an active layer, and a method of manufacturing the same.

An embodiment provides a semiconductor light emitting device comprising: a first conductive semiconductor layer, a lower super lattice layer under the first conductive semiconductor layer, an active layer on the first conductive semiconductor layer, a second conductive super lattice layer on the active layer, and a second conductive semiconductor layer on the second conductive super lattice layer.

An embodiment provides a semiconductor light emitting device comprising; a super lattice layer, a first nitride layer on the first super lattice layer; a second super lattice layer on the first nitride layer; a first conductive semiconductor layer on the second super lattice layer, an active layer on the first conductive semiconductor layer, and a second conductive semiconductor layer on the active layer.

An embodiment provides a method of manufacturing a semiconductor light emitting device comprising; forming a lower super lattice layer, forming a first conductive semiconductor layer on the lower super lattice layer, forming an active layer on the first conductive semiconductor layer, forming a second conductive super lattice layer on the active layer, and forming a second conductive semiconductor layer on the second conductive super lattice layer.

DETAILED DESCRIPTION OF THE EMBODIMENTS

A semiconductor light emitting device and a method for manufacturing the same according to an embodiment will be described in detail with reference to the accompanying drawings. In the description of embodiments, it will be understood that when a layer is referred to as being 'on' or 'under' another layer, the reference about 'on' and 'under' each layer will be made on the basis of drawings. Also, the thickness of each layer in the drawings is an example, and is not limited thereto.

Figure 1:
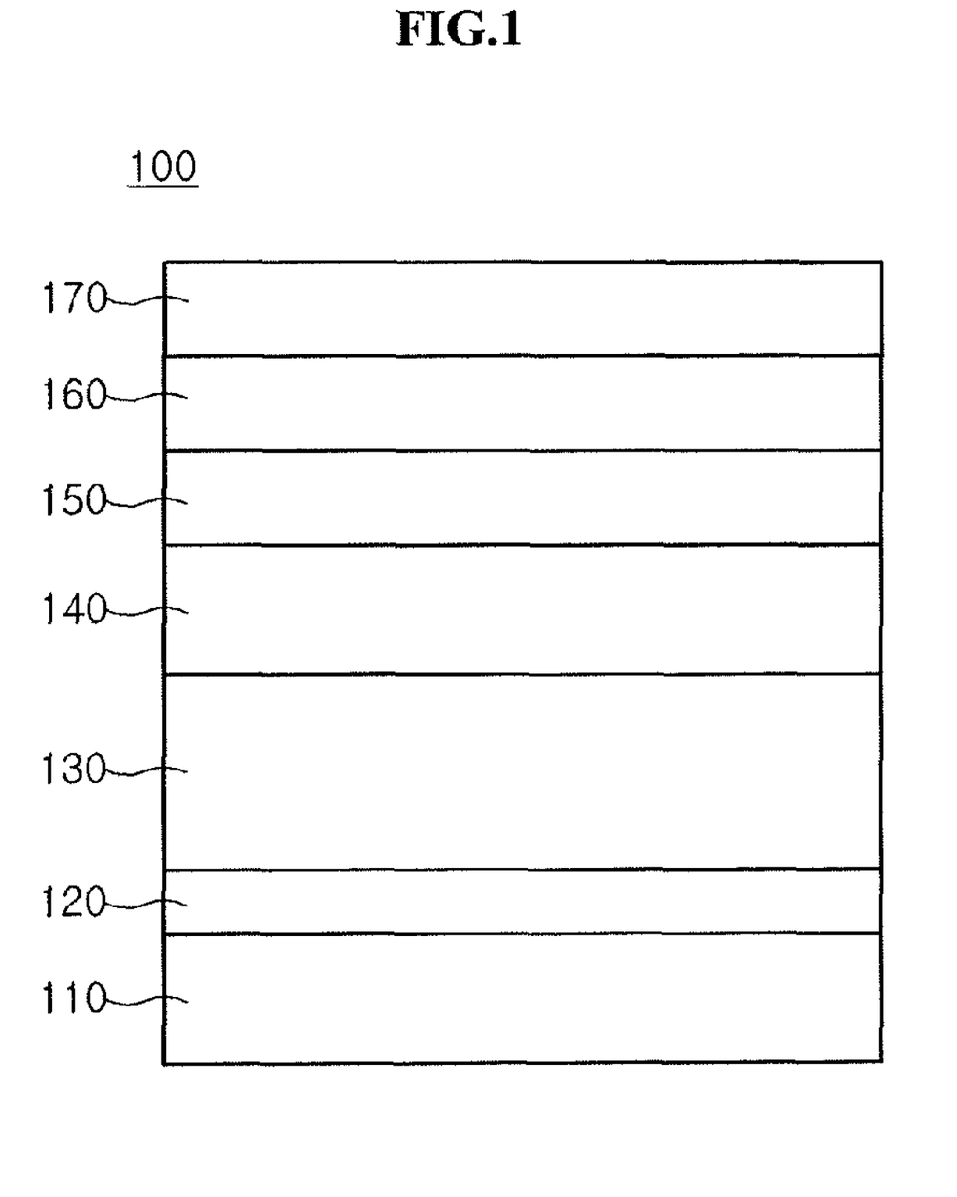
FIG. 1 is a sectional view illustrating a semiconductor light emitting device according to a first embodiment.

FIG. 1 is a sectional view illustrating a semiconductor light emitting device according to a first embodiment.

Referring to FIG. 1, the semiconductor light emitting device 100 comprises a substrate 110, a first buffer layer 120, a first super lattice layer 130, a first conductive semiconductor layer 140, an active layer 150, a second conductive super lattice layer 160 and a second conductive semiconductor layer 170.

The substrate 110 comprises one selected from the group consisting of sapphire substrate $Al_2O_3$, GaN, SiC, ZnO, Si, GaP and GaAs, and may also be removed through a physical and/or chemical scheme before or after an electrode layer is formed.

A nitride semiconductor is grown on the substrate 110 by an E-beam evaporator, a PVD (physical vapor deposition) apparatus, a CVD (chemical vapor deposition) apparatus, a PLD (plasma laser deposition) apparatus, a dual-type thermal evaporator, a sputtering apparatus, and an MOCVD (metal organic chemical vapor deposition) apparatus. However, the scope of the present invention is not limited thereto.

The first buffer layer 120 is formed on the substrate 110 to prevent strain caused by lattices or difference of thermal expansion coefficients between the substrate 110 and an epitaxial layer. A first conductive dopant may be doped into the first buffer layer 120 or not. The first buffer layer 120 having no first conductive dopant may also be removed together with the substrate 110.

For example, the first buffer layer 120 satisfies a composition equation of $Al_Y(Ga_xIn_{1-x})_{1-Y}N(0 \leq X,Y \leq 1)$ and has a thickness of 10 Å to 1000 Å. The first buffer layer 120 is partially polymerized or has a single crystalline structure. The first buffer layer 120 is grown at the growth temperature in the range of 300° C. to 1100° C. and has resistance in the range of $1 \times 10^6$ Ωcm to $1 \times 10^{-4}$ Ωcm. Further, the first buffer layer 120 has one of hexagonal, Wurtzite and Zinc blend structures.

The first super lattice layer 130 is formed on the first buffer layer 120. The first super lattice layer 130 can be formed by alternately laminating layers having a composition equation of $Al_Y(Ga_xIn_{1-x})_{1-Y}N(0 \leq X, Y \leq 1)$. The first super lattice layer 130 can be formed by alternately laminating compound semiconductor layers containing at least one of III group elements Al, Ga and In and V group element N. For example, the first super lattice layer 130 is prepared as a pair of GaN/AlInGaN, GaN/InN, and GaN/InN/AlGaN. A conductive dopant may be doped into the first super lattice layer 130 or not. The conductive dopant comprises a first conductive dopant and/or a second conductive dopant.

The first super lattice layer 130 is grown into a super lattice structure by supplying source gas comprising N and at least one of Al, Ga and In at the growth temperature of 500° C. to 1100° C. For example, each layer of the first super lattice layer 130 may have a thickness of 5 Å to 100 nm and the first super lattice layer 130 may have 1 to 50 pairs of layers and carrier concentration of $10^{16}/cm^3$ to $5 \times 10^{18}/cm^3$. Further, the first super lattice layer 130 may have one of hexagonal, Wurtzite and Zinc blend structures.

The first super lattice layer 130 attenuates strain. In detail, the strain transferred through the first buffer layer 120 can be attenuated by the first super lattice layer 130.

A nitride layer satisfying a composition equation of $Al_Y(Ga_xIn_{1-x})_{1-Y}N(0 \leq X, Y \leq 1)$ may be formed between the first buffer layer 120 and the first super lattice layer 130.

The first conductive semiconductor layer 140 is formed on the first super lattice layer 130. For example, the first conductive semiconductor layer 140 comprises semiconductors selected from InAlGaN, GaN, AlGaN, InGaN, AlN and InN that satisfy a composition equation of $In_xAl_yGa_{1-x-y}N$ ($0 \leq x \leq 1$, $0 \leq y \leq 1$, $0 \leq x+y \leq 1$). The first conductive dopant is doped into the first conductive semiconductor layer 140. The first conductive dopant comprises Si, Ge, Sn, Se, Te and the like.

The active layer 150 is formed on the first conductive semiconductor layer 140. The active layer 150 has a single quantum well structure or a multi-quantum well structure. The active layer 150 is selectively formed according to a desired wavelength by using N and at least one of Al, Ga and In. Further, the active layer 150 having the multi-quantum well structure may have a multi-layer configuration in which the layers constituting the multi-layer configuration may have the same composition or different compositions, and may have a thickness of 5 nm to 40 nm with an arrangement of a quantum well layer (not shown) and a quantum barrier layer (not shown).

The second conductive super lattice layer 160 is formed on the active layer 150. The second conductive super lattice layer 160 is doped with second conductive dopant. The second conductive super lattice layer 160 can be formed by alternately laminating layers having a composition equation of $Al_Y(Ga_xIn_{1-x})_{1-Y}N(0 \leq X, Y \leq 1)$. The second conductive super lattice layer 160 comprises 1 to 30 pairs of layers grown at the predetermined growth temperature. For example, each layer of the second conductive super lattice layer 160 may have a thickness of 5 Å to 100 nm.

The second conductive super lattice layer 160 has carrier concentration of $10^{16}/cm^3$ to $5 \times 10^{22}/cm^3$ and resistance of $1 \times 10^{-4}$ Ωcm to $1 \times 10^{12}$ Ωcm. The second conductive super lattice layer 160 may have one of hexagonal, Wurtzite and Zinc blend structures.

Each pair of the first super lattice layer 130 and the second conductive super lattice layer 160 may have doping concentration, thickness and composition equation which may vary depending on application.

The second conductive semiconductor layer 170 is formed on the second conductive super lattice layer 160. The second conductive semiconductor layer 170 is doped with the second conductive dopant and comprises semiconductors selected from InAlGaN, GaN, AlGaN, InGaN, AlN and InN that satisfy a composition equation of $In_xAl_yGa_{1-x-y}N$ ($0 \leq x \leq 1$, $0 \leq y \leq 1$, $0 \leq x+y \leq 1$). A third conductive semiconductor layer (not shown) and/or a transparent electrode layer (not shown) may be formed on the second conductive semiconductor layer 170.

If the first conductive semiconductor layer 140 is an N type semiconductor layer, the third conductive semiconductor layer is prepared in the form of an N type semiconductor layer. However, if the first conductive semiconductor layer 140 is a P type semiconductor layer, the third conductive semiconductor layer is prepared in the form of a P type semiconductor layer. Thus, the semiconductor light emitting device 100 may comprise at least one of N-P, P-N, N-P-N and P-N-P junction structures.

Figure 2:
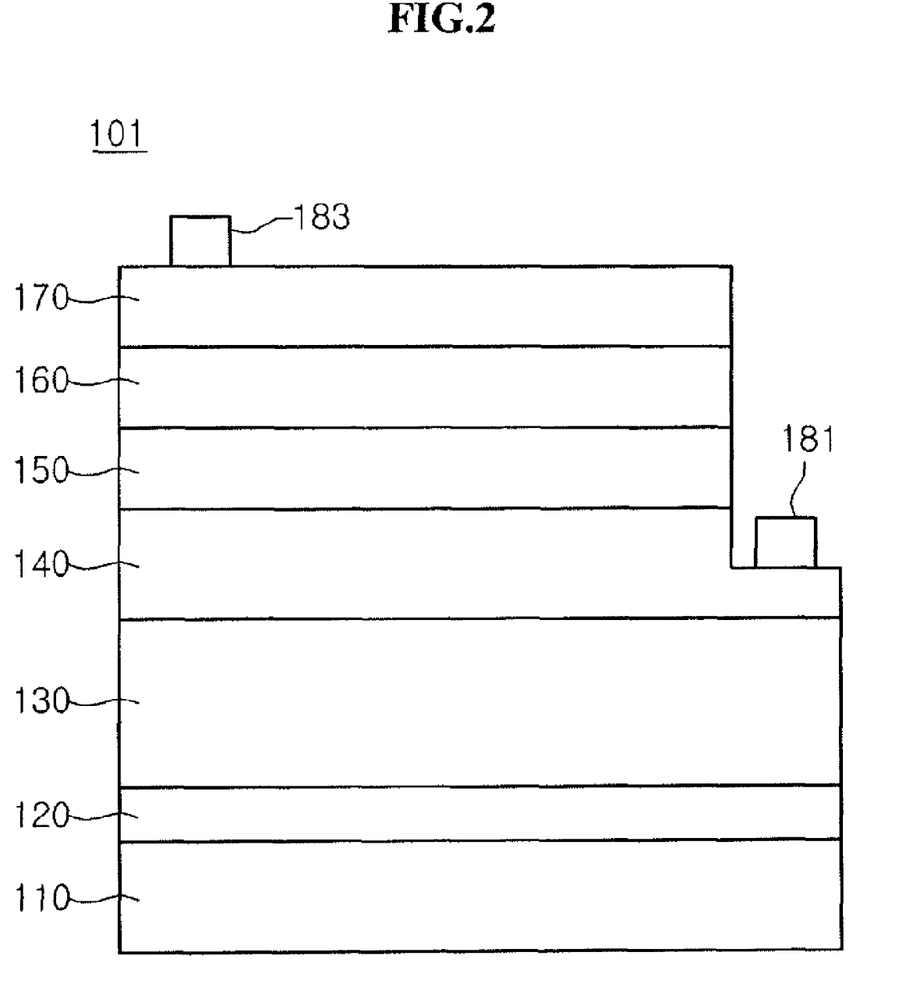
FIG. 2 is a sectional view illustrating a horizontal semiconductor light emitting device based on the semiconductor light emitting device of FIG. 1.

FIG. 2 is a sectional view illustrating a horizontal semiconductor light emitting device based on the semiconductor light emitting device of FIG. 1. In the following description of FIG. 2, the elements that have been described with reference to FIG. 1 will be denoted with the same reference numerals, and the detailed description thereof will be omitted.

Referring to FIG. 2, the semiconductor light emitting device 101 comprises a first electrode layer 181 formed on the first conductive semiconductor layer 140, and a second electrode layer 183 formed on the second conductive semiconductor layer 170.

Further, the embodiment can provide a vertical semiconductor light emitting device based on the semiconductor light emitting device of FIG. 1. For example, in the semiconductor light emitting device of FIG. 1, a reflective electrode layer (not shown) and a conductive support substrate (not shown) are formed on the second conductive semiconductor layer 170. The substrate 110, the first buffer layer 120 and the first super lattice layer 130 are removed using physical and/or chemical etching, and a first electrode layer is formed below the first conductive semiconductor layer 140. The first buffer layer 120 or the first super lattice layer 130 may not be removed if the first buffer layer 120 or the first super lattice layer 130 has specific conductive property.

Figure 3:
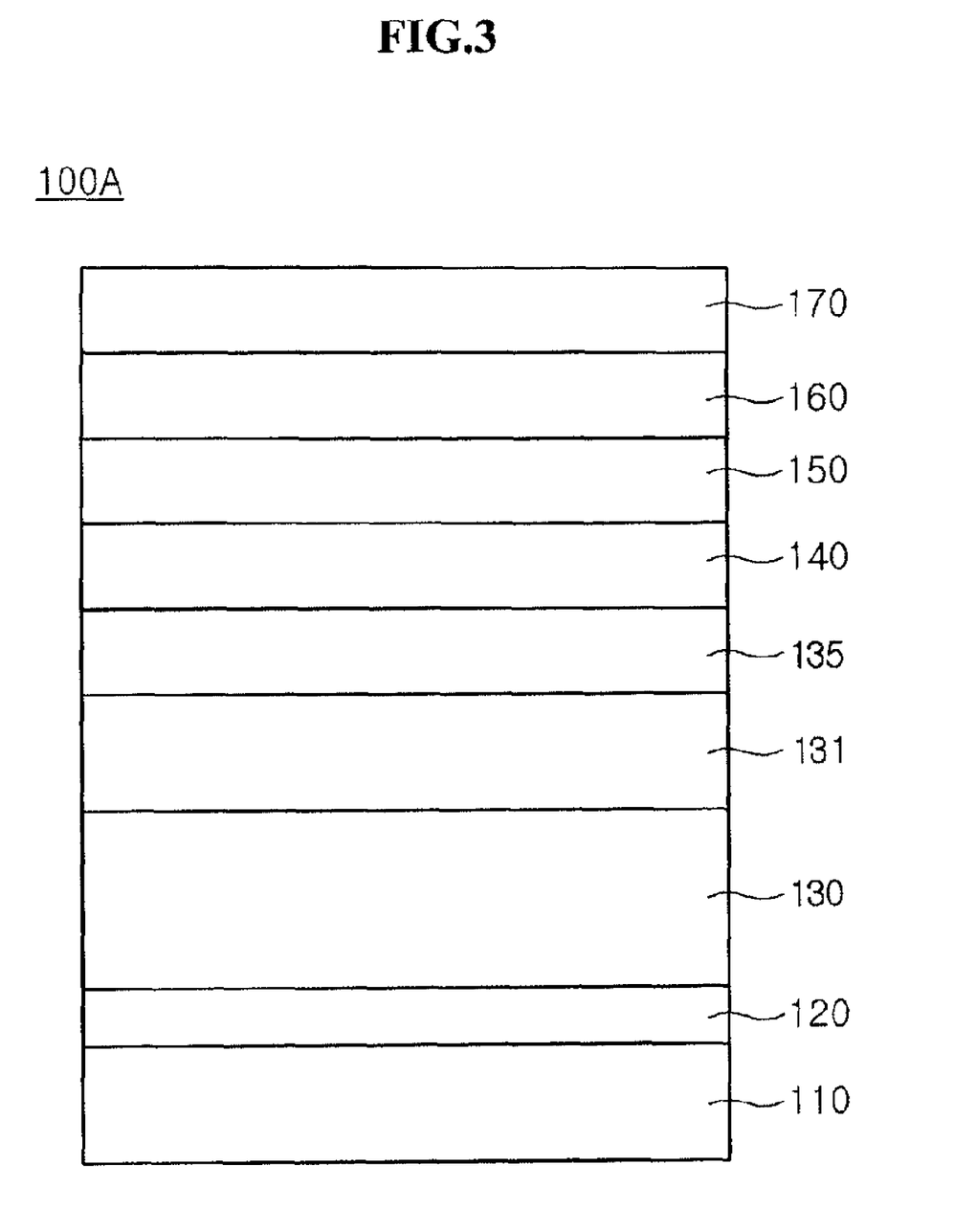
FIG. 3 is a sectional view illustrating a semiconductor light emitting device according to a second embodiment.

FIG. 3 is a sectional view illustrating a semiconductor light emitting device according to a second embodiment. In the following description of FIG. 3, the same elements that have been described with reference to the first embodiment will be denoted with the same reference numerals, and the detailed description thereof will be omitted.

Referring to FIG. 3, the semiconductor light emitting device 100A comprises a substrate 110, a first buffer layer 120, a first super lattice layer 130, a first nitride layer 131, a second super lattice layer 135, a first conductive semiconductor layer 140, an active layer 150, a second conductive super lattice layer 160 and a second conductive semiconductor layer 170.

According to the second embodiment, the super lattice layers 130 and 135 are formed below the first conductive semiconductor layer 140 or the active layer 150 while being spaced apart from each other. The growth conditions and composition materials of the super lattice layers 130 and 135 may be identical to or different from each other.

The first super lattice layer 130 can be formed on the first buffer layer 120 by alternately laminating layers having a composition equation of $Al_Y(Ga_xIn_{1-x})_{1-Y}N(0 \leq X, Y \leq 1)$, and may be doped with a first conductive dopant. For example, the first super lattice layer 130 may have 1 to 50 pairs of layers, and each layer of the first super lattice layer 130 may have a thickness of about 5 Å to 100 nm. The first super lattice layer 130 is grown at the temperature of 500~1100° C. and has carrier concentration of $10^{16}/cm^3$ to $5\times10^{18}/cm^3$. Further, the first super lattice layer 130 has one of hexagonal, Wurtzite and Zinc blend structures.

The first super lattice layer 130 primarily attenuates strain. In detail, the strain transferred through the first buffer layer 120 can be attenuated by the first super lattice layer 130.

A layer having a composition equation of $Al_Y(Ga_xIn_{1-x})_{1-Y}N(0\leq X,Y\leq 1)$ may be formed between the first buffer layer 120 and the first super lattice layer 130. However, the scope of the present invention is not limited thereto.

The first nitride layer 131 is formed on the first super lattice layer 130. The first nitride layer 131 has a composition equation of $Al_Y(Ga_xIn_{1-x})_{1-Y}N(0\leq X,Y\leq 1)$, and may be doped with the first conductive dopant. For example, the first nitride layer 131 may have a thickness of 0.001 um to 3 um at the growth temperature is 500° C. to 1200° C. The first nitride layer 131 may have carrier concentration of $10^{15}/cm^3$ to $10^{20}/cm^3$ and resistance of $1\times10^4$ Ωcm to $1\times10^{-4}$ Ωcm. The first nitride layer 131 may have one of hexagonal, Wurtzite and Zinc blend structures. The first nitride layer 131 can improve the quality of the semiconductor layer on the first super lattice layer 130.

The second super lattice layer 135 is formed on the first nitride layer 131. The second super lattice layer 135 can be formed by alternately laminating layers having a composition equation of $Al_Y(Ga_xIn_{1-x})_{1-Y}N(0\leq X\leq 1, 0<Y\leq 0.4)$ and may be doped with the first conductive dopant. The second super lattice layer 135 comprises a predetermined number of material layers having a super lattice structure and the material layers form a predetermined number (e.g. 1 to 50) of pairs. For example, each layer of the second super lattice layer 135 may have a thickness of about 10 Å~500 nm at the growth temperature is 500° C. to 1100° C. The second super lattice layer 135 may have carrier concentration is $10^{17}/cm^3$ to $8\times10^{20}/cm^3$. The second super lattice layer 135 may have one of hexagonal, Wurtzite and Zinc blend structures.

One pair of the second super lattice layer 135 comprises layers having compositions different from each other or having the same composition, and each pair may comprise one to three layers.

The composition and doping concentration of the conductive dopant for the first and second super lattice layers 130 and 135 may be identical to or different from each other.

The first conductive semiconductor layer 140 is formed on the second super lattice layer 135, the active layer 150 is formed on the first conductive semiconductor layer 140, the second conductive super lattice layer 160 is formed on the active layer 150, and the second conductive semiconductor layer 170 is formed on the second conductive super lattice layer 160. Further, a third conductive semiconductor layer (not shown) and/or a transparent electrode layer (not shown) may be formed on the second conductive semiconductor layer 170.

The semiconductor light emitting device according to the second embodiment can be prepared in the form of a horizontal or vertical light emitting device, and can be formed with at least one of N-P, P-N, N-P-N and P-N-P junction structures.

According to the second embodiment, the super lattice layers 130 and 135 are disposed between the substrate 110 and the first conductive semiconductor layer 140, so that strain transferred from the substrate 110 can be reduced step by step. For example, the first super lattice layer 130 primarily reduces the strain which is not reduced by the first buffer layer 120, and the second super lattice layer 135 secondarily reduces the remaining strain, so that ESD (electrostatic discharge) properties of the active layer 150 can be improved.

Figure 4:
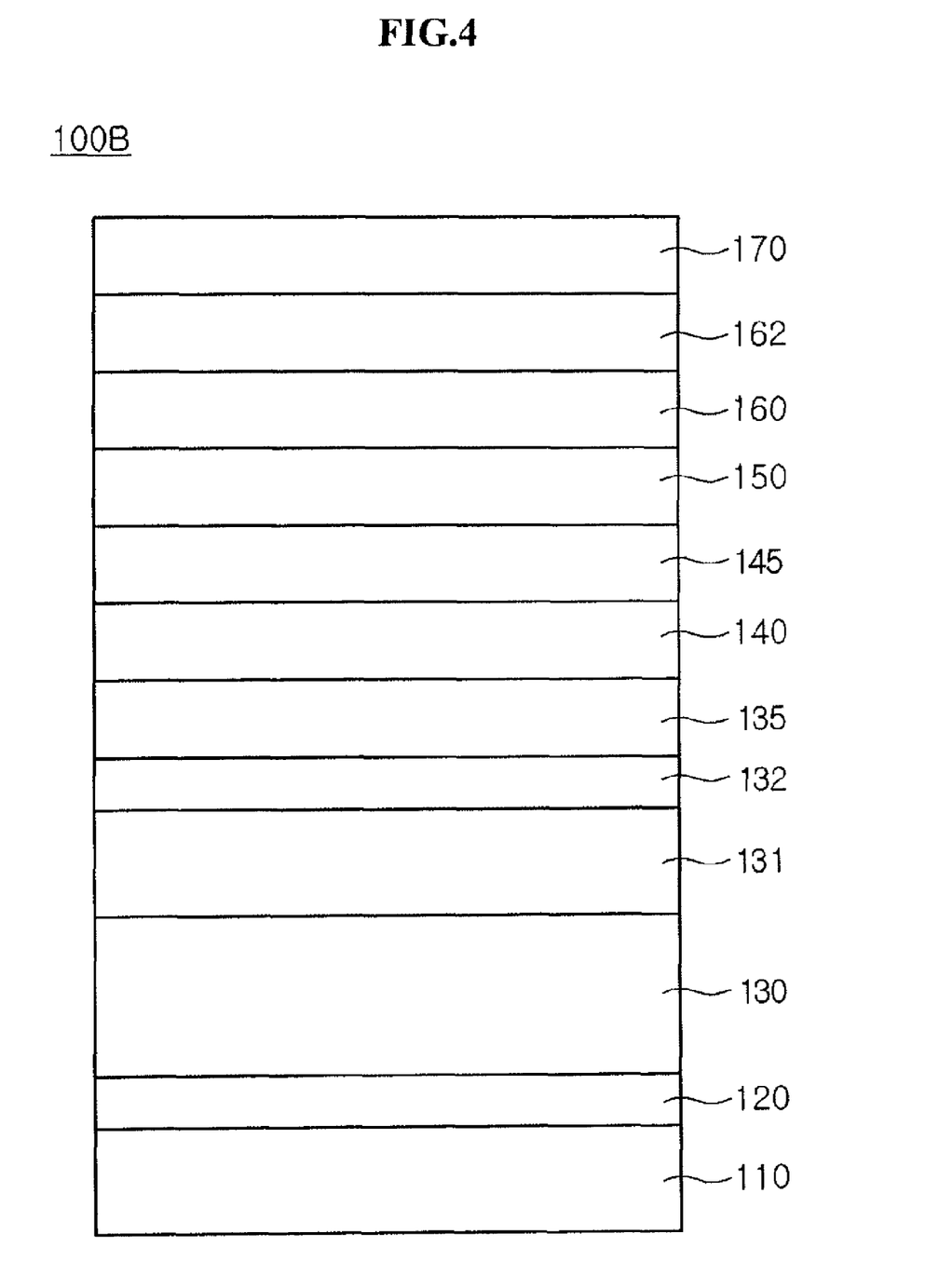
FIG. 4 is a sectional view illustrating a semiconductor light emitting device according to a third embodiment.

FIG. 4 is a sectional view illustrating a semiconductor light emitting device according to a third embodiment. In the following description of FIG. 4, the same elements that have been described with reference to the first and second embodiments will be denoted with the same reference numerals, and the detailed description thereof will be omitted.

Referring to FIG. 4, the semiconductor light emitting device 100B comprises plural super lattice layers 130 and 135 and plural buffer layers 120 and 132 formed below a first conductive semiconductor layer 140.

The semiconductor light emitting device 100B comprises a substrate 110, a first buffer layer 120, a first super lattice layer 130, a first nitride layer 131, a second buffer layer 132, a second super lattice layer 135, a first conductive semiconductor layer 140, a first conductive nitride layer 145, an active layer 150, a second conductive super lattice layer 160, a second conductive nitride layer 162 and a second conductive semiconductor layer 170.

The first super lattice layer 130 is formed on the first buffer layer 120, the first nitride layer 131 is formed on the first super lattice layer 130, the second buffer layer 132 is formed on the first nitride layer 131, and the second super lattice layer 135 is formed on the second buffer layer 132. The first and second buffer layers 120 and 132 may have the same physical and chemical properties. In the structure of the semiconductor light emitting device 100B, the substrate 110, the first buffer layer 120, the first super lattice layer 130, the first nitride layer 131 and the second buffer layer 132 may be removed before or after an electrode layer is formed.

The second buffer layer 132 secondarily prevents defect generated from the layers below the second buffer layer 132.

For example, the second buffer layer 132 may have a thickness of 0.0001 um to 0.1 um at the growth temperature of 400° C. to 1200° C. At this time, the second buffer layer 132 prevents threading dislocation transferred from the substrate 110 through semiconductor layers. The second buffer layer 132 may have the material composition ratio or growth temperature different from that of the first buffer layer 120.

The first conductive nitride layer 145 is formed on the first conductive semiconductor layer 140. The first conductive nitride layer 145 has a composition equation of $Al_Y(Ga_xIn_{1-x})_{1-Y}N(0\leq X,Y\leq 1)$ and may have a thickness of 0.0001 um to 0.5 um at the growth temperature of 700° C. to 950° C.

The second conductive nitride layer 162 is formed on the second conductive super lattice layer 160 and the second conductive semiconductor layer 170 is formed on the second conductive nitride layer 162.

A second conductive dopant is doped into the second conductive nitride layer 162 satisfying a composition equation of $Al_Y(Ga_xIn_{1-x})_{1-Y}N(0\leq X,Y\leq 1)$. The second conductive nitride layer 162 has carrier concentration of $10^{16}/cm^3$ to $10^{22}/cm^3$, resistance of $10^{-4}$ Ωcm to $10^{12}$ Ωcm and thickness of 5 nm to 100 nm. Further, the second conductive nitride layer 162 may have one of hexagonal, Wurtzite and Zinc blend structures.

The semiconductor light emitting device according to the third embodiment can be prepared in the form of a horizontal or vertical light emitting device, and can be formed with at least one of N-P, P-N, N-P-N and P-N-P junction structures.

According to the third embodiment, the super lattice layers 130 and 135 and the buffer layers 120 and 132 are formed below the active layer 150, so that strain transferred to the active layer 150 can be minimized.

Figure 5:
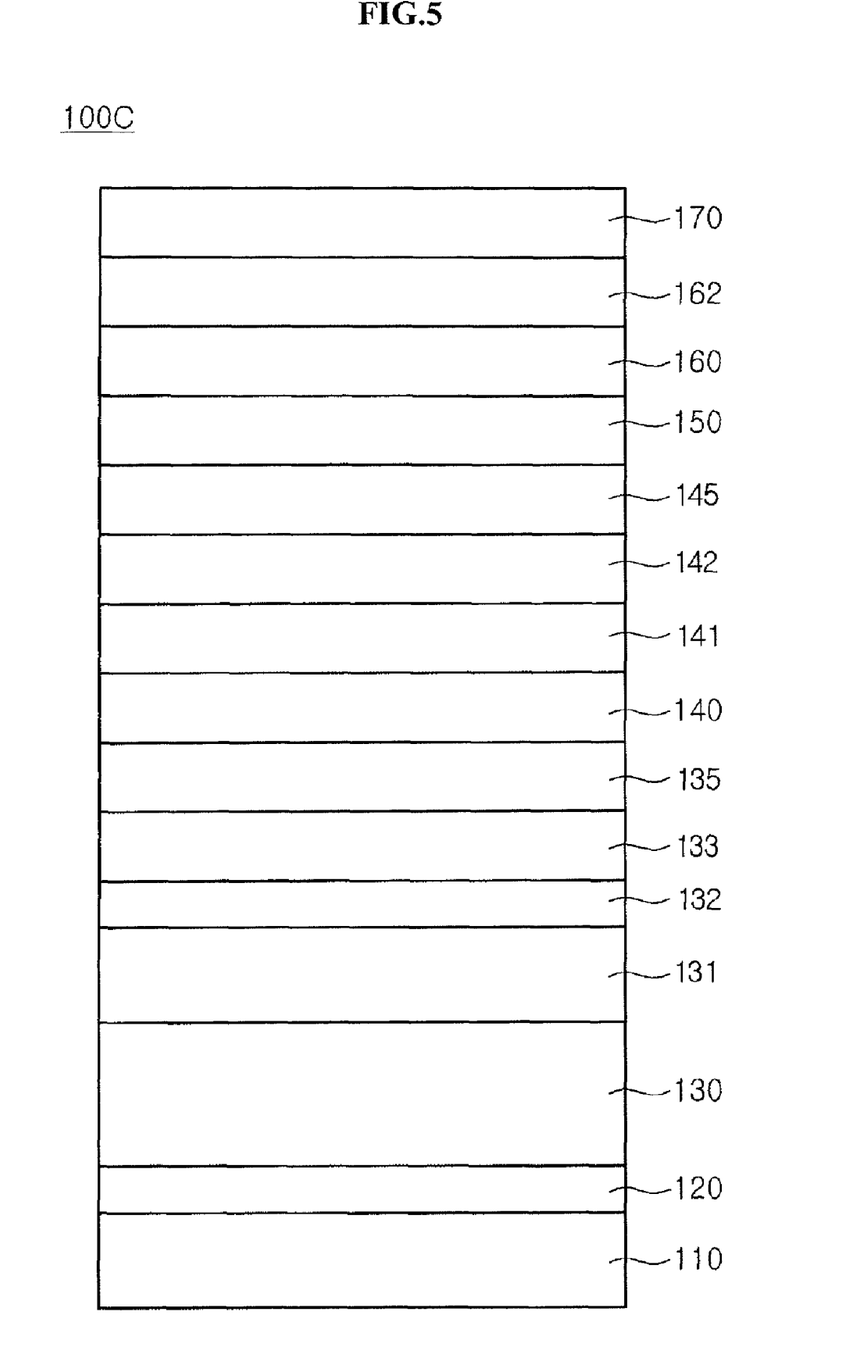
FIG. 5 is a sectional view illustrating a semiconductor light emitting device according to a fourth embodiment.

FIG. 5 is a sectional view illustrating a semiconductor light emitting device according to a fourth embodiment. In the following description of FIG. 5, the same elements that have been described with reference to the first to third embodiments will be denoted with the same reference numerals, and the detailed description thereof will be omitted.

Referring to FIG. 5, the semiconductor light emitting device 100C comprises a substrate 110, a first buffer layer 120, a first super lattice layer 130, a first nitride layer 131, a second buffer layer 132, a second nitride layer 133, a second super lattice layer 135, a first conductive semiconductor layer 140, a third super lattice layer 141, a first-A conductive semiconductor layer 142, a first conductive nitride layer 145, an active layer 150, a second conductive super lattice layer 160, a second conductive nitride layer 162 and a second conductive semiconductor layer 170.

The substrate 110, the first buffer layer 120, the first super lattice layer 130, the first nitride layer 131, the second buffer layer 132, the second nitride layer 133 and the second super lattice layer 135 are sequentially formed below the first conductive semiconductor layer 140.

The first nitride layer 131, the second buffer layer 132 and the second nitride layer 133 are sequentially formed between the first super lattice layer 130 and the second super lattice layer 135.

The first nitride layer 131 satisfies a composition equation of $Al_Y(Ga_xIn_{1-x})_{1-Y}N (0 \leq X, Y \leq 1)$ and may be doped with a first conductive dopant. For example, the first nitride layer 131 may have a thickness of 0.001 um to 3 um at the growth temperature of 500° C. to 1200° C. The first nitride layer 131 may have carrier concentration of $10^{15}/cm^3$ to $10^{20}/cm^3$ and resistance of $1 \times 10^4$ Ωcm to $1 \times 10^{-4}$ Ωcm. Further, the first nitride layer 131 may have one of hexagonal, Wurtzite and Zinc blend structures. The first nitride layer 131 can improve the quality of the semiconductor layer on the first super lattice layer 130.

The second nitride layer 133 satisfying a composition equation of $Al_Y(Ga_xIn_{1-x})_{1-Y}N (0 \leq X, Y \leq 1)$ is formed on the second buffer layer 132. For example, the second nitride layer 133 may have a thickness of 0.001 um to 3 um at the growth temperature of 500° C. to 1200° C. The second nitride layer 133 may be doped with a first conductive dopant and may have one of hexagonal, Wurtzite and Zinc blend structures. The second nitride layer 133 can improve the quality of the semiconductor layer.

The third super lattice layer 141 is formed on the first conductive semiconductor layer 140. The third super lattice layer 141 can be formed by alternately laminating layers having a composition equation of $Al_Y(Ga_xIn_{1-x})_{1-Y}N$ (0<Y<0.25, 0≦X≦1). Each layer of the third super lattice layer 141 may have a thickness of 10 Å to 500 nm and may have one of hexagonal, Wurtzite and Zinc blend structures.

The first-A conductive semiconductor layer 142 is formed on the third super lattice layer 141. For example, the first-A conductive semiconductor layer 142 comprises semiconductor materials selected from InAlGaN, GaN, AlGaN, InGaN, AlN and InN that satisfy a composition equation of $In_xAl_yGa_{1-x-y}N$ (0≦x≦1, 0≦y≦1, 0≦x+y≦1). The first-A conductive semiconductor layer 142 may be doped with the first conductive dopant and may have carrier concentration of $10^{16}/cm^3$ to $10^{20}/cm^3$.

The semiconductor light emitting device 100C according to the fourth embodiment can be prepared in the form of a horizontal semiconductor light emitting device by performing Mesa etching, or a vertical semiconductor light emitting device after a reflective electrode layer and a conductive support substrate are formed and then the substrate is removed. However, the scope of the present invention is not limited thereto.

According to the fourth embodiment, three or more super lattice layers 130, 135 and 141 are formed below the active layer 150, so that interlayer stress can be reduced. Further, the first buffer layer 120 is formed below the first super lattice layer 130 and the second buffer layer 132 is formed below the second super lattice layer 135, so that strain transferred from the substrate 110 can be reduced. Thus, the strain transferred to the active layer 150 can be reduced step by step and ESD properties of the active layer 150 can be improved.

Meanwhile, the active layer 150 according to the first to fourth embodiments comprises a single quantum well structure or a multi-quantum well structure. The active layer 150 can be formed by alternately laminating a quantum well layer (not shown) and a quantum barrier layer (not shown) at a predetermined cycle of 2 to 10. However, the scope of the present invention is not limited thereto.

Further, the quantum well layer of the active layer 150, for example, may comprise InGaN or InAlGaN. The quantum barrier layer, for example, may comprise AlGaN or InAlGaN. Further, the quantum barrier layer may comprise GaN.

The active layer 150 comprises materials having band gap energy according to wavelength of emitted light. For example, the quantum well layer and the quantum barrier layer can be formed with a cycle of InGaN/GaN, a cycle of InGaN/AlGaN, or a cycle of InAlGaN/InAlGaN. Further, the active layer 150 may comprise materials emitting chromatic light such as orange light, yellow light, purple light, ultraviolet light, light having a red wavelength, and light having a green wavelength.

For example, in order to form the active layer 150, source gas, such as $NH_3$, TMGa (or TEGA) and TMIn, is selectively supplied by using carrier gas, such as $H_2$ and/or $N_2$, at the predetermined growth temperature (e.g. 700° C. to 950° C.), thereby forming the quantum well layer comprising InGaN and the quantum barrier layer comprising GaN. When the quantum barrier layer comprises AlGaN, the quantum barrier is formed by supplying TMAl as source gas.

In the quantum well layer containing indium, a composition ratio of indium can be reduced step by step. In the quantum barrier layer containing AlGaN, a composition ratio of aluminum is reduced step by step. Further, the quantum well layer, in which the composition ratio of indium has been changed, can be applied to at least one layer or all layers. Further, the quantum barrier layer, in which the composition ratio of aluminum has been changed, can be applied to at least one layer or all layers.

Each quantum well layer has a thickness of 15 Å to 30 Å and each quantum barrier layer has a thickness of 50 Å to 300 Å. However, the scope of the present invention is not limited thereto.

Meanwhile, the active layers 150 disclosed in the first to fourth embodiments comprise characteristics of one active layer disclosed in embodiments of FIGS. 6 to 11.

Further, the technical features of the first to fourth embodiments can be applied to other embodiments.

FIGS. 6 to 11 are energy band diagrams of an active layer according to fifth to eleventh embodiments. Hereinafter, for convenience in description, a first conductive type semiconductor layer will be referred to as an n-type semiconductor layer or an n-side, a second conductive type semiconductor layer will be referred to as a p-type semiconductor layer or a p-side.

Figure 6:
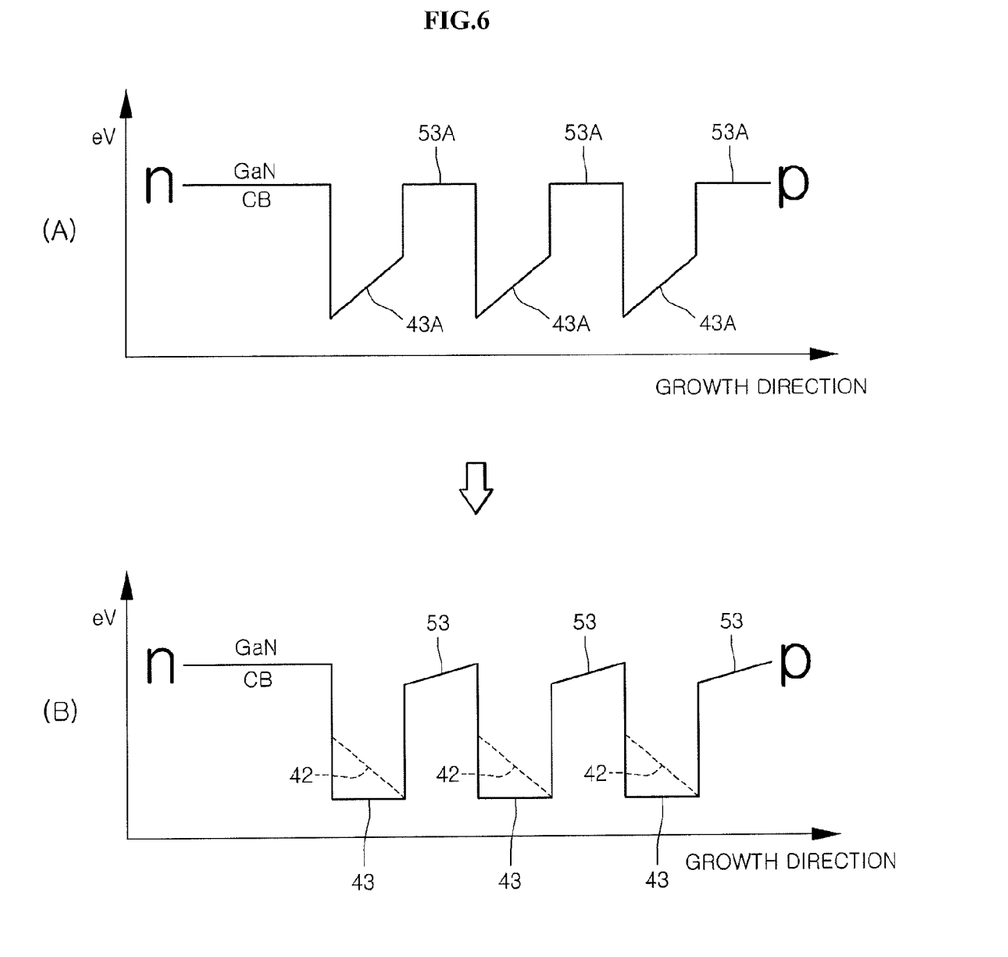
FIG. 6 is an energy band diagram of an active layer according to a fifth embodiment.

FIG. 6 is an energy band diagram of an active layer according to a fifth embodiment. FIG. 6A is a band diagram of an active layer designed in anticipation of a stress of a quantum well layer, and FIG. 6B is a band diagram after growing the active layer designed as illustrated in FIG. 6A.

Referring to FIG. 6A, a band diagram of a quantum well layer 43A is designed in anticipation of a quantum well layer 42 (dot line) to be deformed due to a stress as illustrated in FIG. 6B. That is, an energy band potential of the quantum well layer 43A is designed so that an n-type semiconductor layer side is low, and a p-type semiconductor layer side is high. Here, the energy band of the quantum well layer 43A may be designed so that the energy band potential of the n-type semiconductor layer side is lower than a reference potential, and the energy band potential of the p-type semiconductor layer side is equal to the reference potential.

A quantum barrier layer 53A is designed with a flat energy band.

Referring to FIG. 6B, an active layer is grown according to the band diagram designed as illustrated in FIG. 6A. In initial growth, a quantum well layer 43 of the active layer has a relatively high In content, and thereafter, the In content is reduced in a graded manner up to a reference amount during the growth. As a result, the quantum well layer 43 can have an energy band (or an approximately flat band) having uniform band gap. That is, in an energy band potential of the quantum well layer 43, the energy band potential of the n-type semiconductor layer side is equal to that of the p-type semiconductor layer side.

Each quantum well layer 43 is grown by changing $In_aGa_bN/In_{a1}Ga_{b1}N$ ($0<a\leq1$, $0<a1\leq1$, $b=1-a$, $b1=1-a1$, $a>a1$) according to a growth time.

An In composition ratio of the InGaN quantum well layer 43 can be reduced in a graded manner to compensate an energy deformation due to a stress generated at a boundary between the InGaN quantum well layer 43 and the GaN or AlGaN quantum barrier layer 53A. Also, the quantum well layer 43 the approximately flat energy band or the uniform band gap can be applied to at least one layer or all layers of the quantum well layer 43.

A stress is applied to an energy band potential of a quantum barrier layer 53 so that the energy band potential of the n-type semiconductor layer side is low, and the energy band potential of the p-type semiconductor layer side is high.

Figure 7:
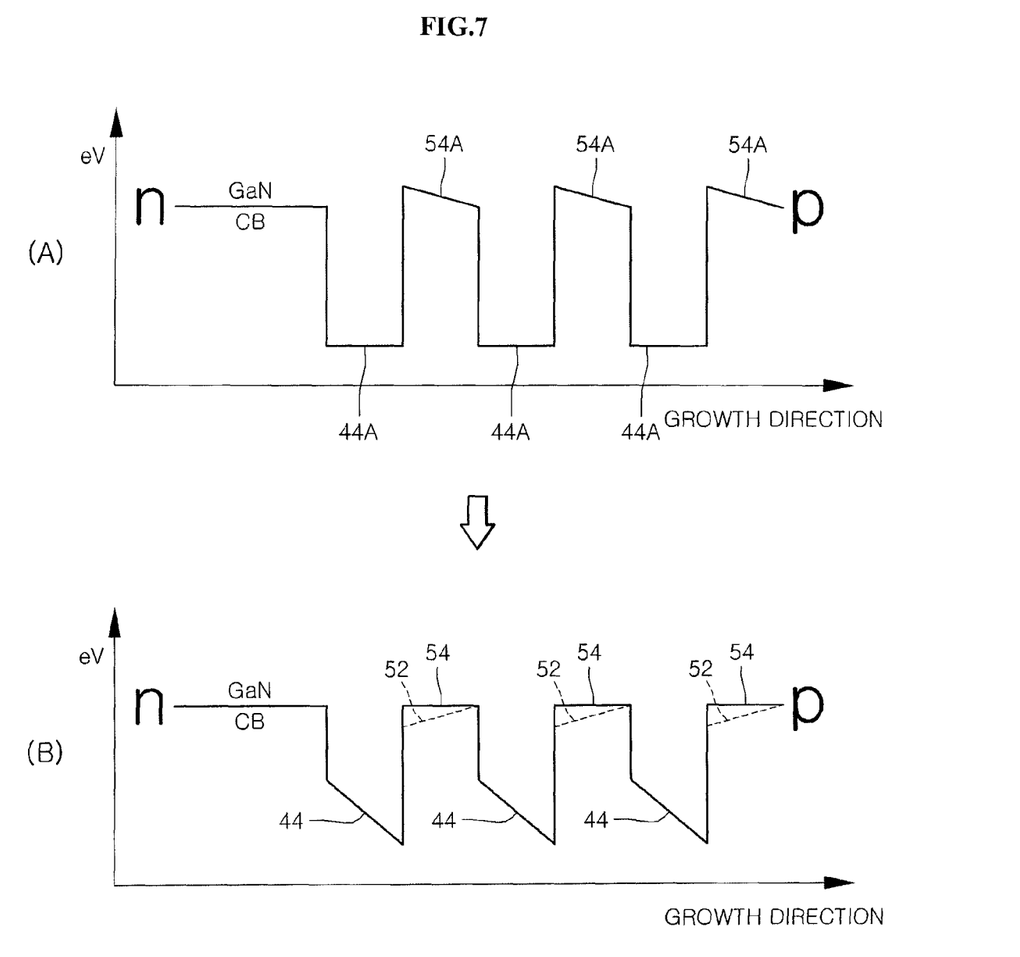
FIG. 7 is an energy band diagram of an active layer according to a sixth embodiment.

FIG. 7 is an energy band diagram of an active layer according to a sixth embodiment. FIG. 7A is a band diagram of an active layer designed in anticipation of a stress of a quantum barrier layer, and FIG. 7B is a band diagram after growing the active layer designed as illustrated in FIG. 7A.

Referring to FIG. 7A, a band diagram of a quantum barrier layer 54A is designed in anticipation of a quantum barrier layer (See reference numeral 52 of FIG. 7B) to be deformed due to a stress. That is, an energy band potential of the quantum barrier layer 54A is designed so that an n-type semiconductor layer side is high, and a p-type semiconductor layer side is low. A quantum well layer 44A is designed with a flat energy band.

Here, the energy band of the quantum barrier layer 54A may be designed so that the energy band potential of the n-type semiconductor layer side is higher than a reference potential, and the energy band potential of the p-type semiconductor layer side is equal to the reference potential.

Referring to FIG. 7B, an active layer is grown according to the band diagram designed as illustrated in FIG. 7A. In initial growth, a quantum barrier layer 54 of the active layer has a relatively high Al content, and thereafter, the Al content is reduced in a graded manner up to a reference amount during the growth. As a result, the quantum barrier layer 54 can have the approximately flat energy band or the uniform band gap.

A stress is applied to an energy band potential of a quantum well layer 44 so that the energy band potential of the n-type semiconductor layer side is high, and the energy band potential of the p-type semiconductor layer side is low.

The quantum well layer 44 is formed of InGaN. The quantum barrier layer 54 can be grown by changing $Al_cGa_dN/Al_{c1}Ga_{d1}N$ ($0<c\leq1$, $0<c1\leq1$, $d=1-c$, $d1=1-c1$, $c>c1$) according to a growth time.

An Al composition ratio may be reduced in a graded manner according to the growth time to form the AlGaN barrier layer 54. Also, a cycle of $Al_cGa_dN/Al_{c1}Ga_{d1}N$ may be repeated to form the quantum barrier layer 54. Bending of the energy band due to the stress can be compensated in the quantum barrier layer 54.

Also, the quantum barrier layer 54 having an approximately flat energy band can be applied to at least one layer or all layers of the quantum barrier layer 54.

Figure 8:
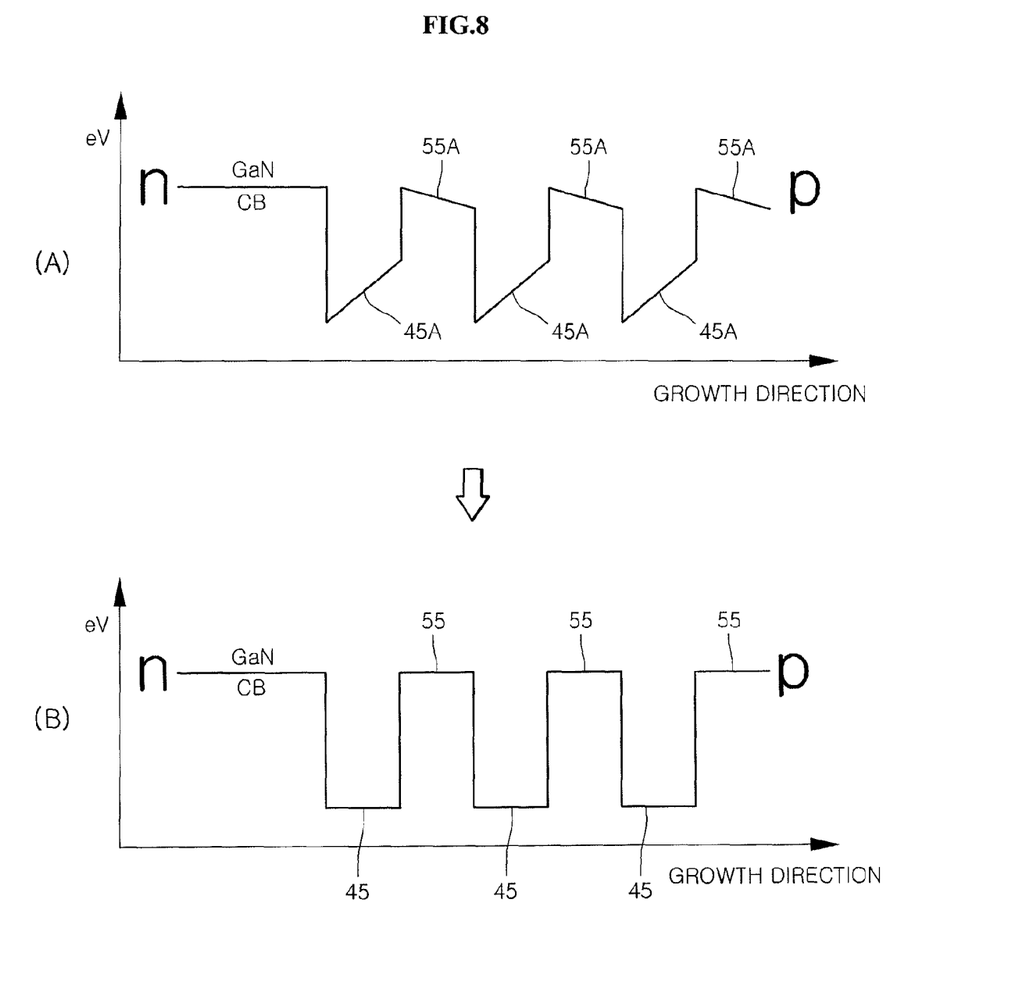
FIG. 8 is an energy band diagram of an active layer according to a seventh embodiment.

FIG. 8 is an energy band diagram of an active layer according to a seventh embodiment. FIG. 8A is a band diagram of an active layer designed in anticipation of stresses of a quantum well layer and a quantum barrier layer, and FIG. 8B is a band diagram after growing the active layer designed as illustrated in FIG. 8A.

Referring to FIG. 8A, a quantum well layer 45A and a quantum barrier layer 55A of an active layer are designed in anticipation of a deformation of an energy band due to a stress. The quantum well layer 45A is formed of InGaN. An energy band potential of the quantum well layer 45A is designed so that the energy band potential of an n-type semiconductor layer side is lower than that of a p-type semiconductor layer side. The quantum barrier layer 55A is formed of AlGaN. An energy band potential of the quantum barrier layer 55A is designed so that the energy band potential of an n-type semiconductor layer side is higher than that of a p-type semiconductor layer side. That is, the energy band potential of the quantum well layer 45A is designed so that the n-type semiconductor layer side is low with respect to the p-type semiconductor layer side. The energy band potential of the quantum barrier layer 55A is designed so that the n-type semiconductor layer side is high with respect to the p-type semiconductor layer side.

In the design of the energy band of the quantum well layer 45A and/or the quantum barrier layer 55A, although the p-type semiconductor layer side is designed as a reference potential, but it is one example. For example, a middle portion of the quantum well layer 45A or the quantum barrier layer 55A or the n-type semiconductor layer side is designed as the reference potential.

Referring to FIG. 8B, an active layer is grown according to the band diagram designed as illustrated in FIG. 8A. In initial growth, a quantum well layer 45 of the active layer has a relatively high In content, and thereafter, the In content is reduced in a graded manner up to a reference amount during the growth. As a result, the quantum well layer 45 can have the approximately flat energy band or the uniform band gap. That is, in the energy band of each quantum well layer 45, the energy band potential of the n-type semiconductor layer side is equal to that of the p-type semiconductor layer side.

The quantum well layer 45 is grown by changing $In_aGa_bN/In_{a1}Ga_{b1}N$ ($0<a\leq1$, $0<a1\leq1$, $b=1-a$, $b1=1-a1$, $a>a1$) according to a growth time.

An In composition ratio of the InGaN quantum well layer 45 can be reduced in a graded manner to compensate an energy deformation due to a stress generated at a boundary between the InGaN quantum well layer 45 and the AlGaN quantum barrier layer 55. Also, the quantum well layer 45 having the approximately flat energy band or the uniform band gap can be applied to at least one layer or all layers of the quantum well layer 43.

In initial growth, a quantum barrier layer 55 of the active layer has a relatively high Al content, and thereafter, the Al content is reduced in a graded manner up to a reference amount during the growth. As a result, the quantum barrier layer 55 can have the approximately flat energy band or the uniform band gap.

The quantum barrier layer 55 can be grown by changing $Al_cGa_dN/Al_{c1}Ga_{d1}N$ ($0<c\leq1$, $0<c1\leq1$, $d=1-c$, $d1=1-c1$, $c>c1$) according to a growth time. An Al composition ratio may be reduced in a graded manner according to the growth time to form the AlGaN barrier layer 55. Also, a cycle of $Al_cGa_dN/Al_{c1}Ga_{d1}N$ may be repeated to form the quantum barrier layer 55. Bending of the energy band due to the stress can be compensated in the quantum barrier layer 55. Also, the quantum barrier layer 55 having the approximately flat energy band or the uniform band gap can be applied to at least one layer or all layers of the quantum barrier layer 55.

The seventh embodiment can compensate the deformation of the energy band due to the stress in at least one cycle or all cycles comprising the cycle of the quantum barrier layer 55 and the quantum well layer 45 of the active layer.

Figure 9:
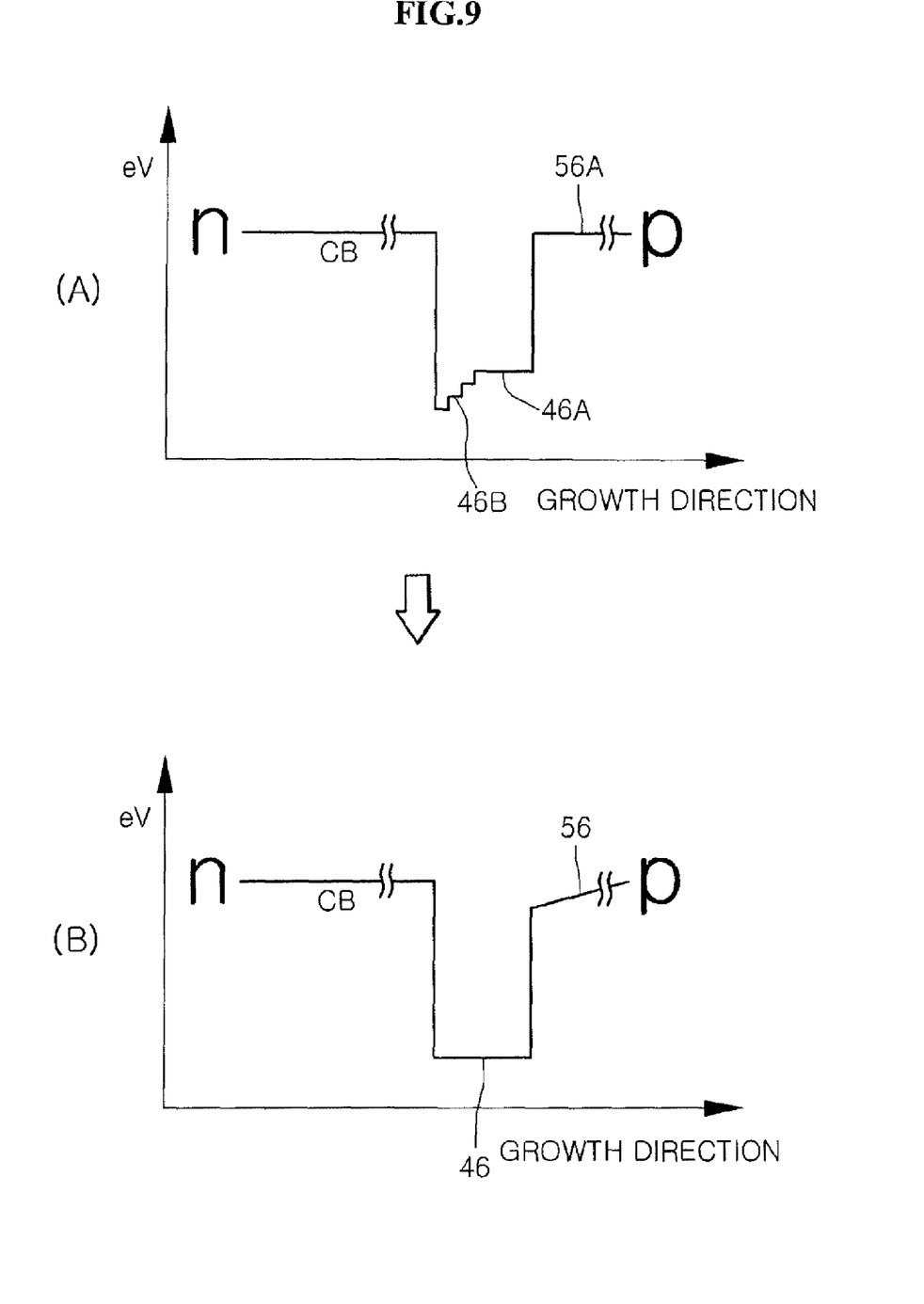
FIG. 9 is an energy band diagram of an active layer according to an eighth embodiment.

FIG. 9 is an energy band diagram of an active layer according to an eighth embodiment. The eighth embodiment will compensate a deformation of an energy band using a quantum well layer having a super lattice structure. FIG. 9A is a band diagram of an active layer designed in anticipation of stresses of a quantum well layer, and FIG. 9B is a band diagram after growing the active layer designed as illustrated in FIG. 9A.

Referring to FIG. 9A, a quantum well layer 46A of an active layer has a super lattice structure 46B. At least one layer or all layers of the quantum well layer 46A may have the super lattice structure 46B, but the present disclosure is not limited thereto.

An n-type semiconductor layer side of the quantum well layer 46A is grown in the super lattice structure 46B and in one cycle or more, and a p-type semiconductor layer side is grown in the super lattice structure 46B or a normal condition. The super lattice structure 46B of the quantum well layer 46A may be formed of $In_aGa_bN/In_{a1}Ga_{b1}N$ ($0<a\leq1$, $0<a1\leq1$, $b=1-a$, $b1=1-a1$, $a>a1$).

The super lattice structure 46B of the quantum well layer 46A is grown in order of from a material having a small band gap to a material having a large band gap. Here, the material having the large band gap is a material having a low In content, and the material having the small band gap is a material having high In content.

A quantum barrier layer 56A of the active layer may be formed of AlGaN or GaN and be designed with a flat energy band potential.

Referring to FIG. 9B, an active layer is grown according to the band diagram designed as illustrated in FIG. 9A. In initial growth, a quantum well layer 46 of the active layer may be grown in a cycle of an $In_aGa_bN/In_{a1}Ga_{b1}N$ super lattice structure (See reference numeral 46B of FIG. 9A) and in one cycle or more, and thereafter, may be grown in the normal condition or the above-described super lattice structure. The $In_aGa_bN/In_{a1}Ga_{b1}N$ super lattice structure is grown in order of from the material having the small band gap to the material having the large band gap. That is, the $In_aGa_bN/In_{a1}Ga_{b1}N$ super lattice structure is grown in order of $In_aGa_bN$ and $In_{a1}Ga_{b1}N$ ($0<a1<a\leq1$).

In the InGaN quantum well layer 46A, a deformation of the energy band of the quantum well layer 46 can be compensated using a characteristic in which a band gap is changed according to the In content.

The quantum well layer 46 can have the approximately flat energy band or the uniform band gap because the deformation of the energy band thereof can be compensated.

The active layer according to the eighth embodiment may comprise the quantum well layer 46 having the super lattice structure and selectively comprise the quantum well layer as described in the fifth embodiment and/or the quantum barrier layer as described in the sixth embodiment.

Figure 10:
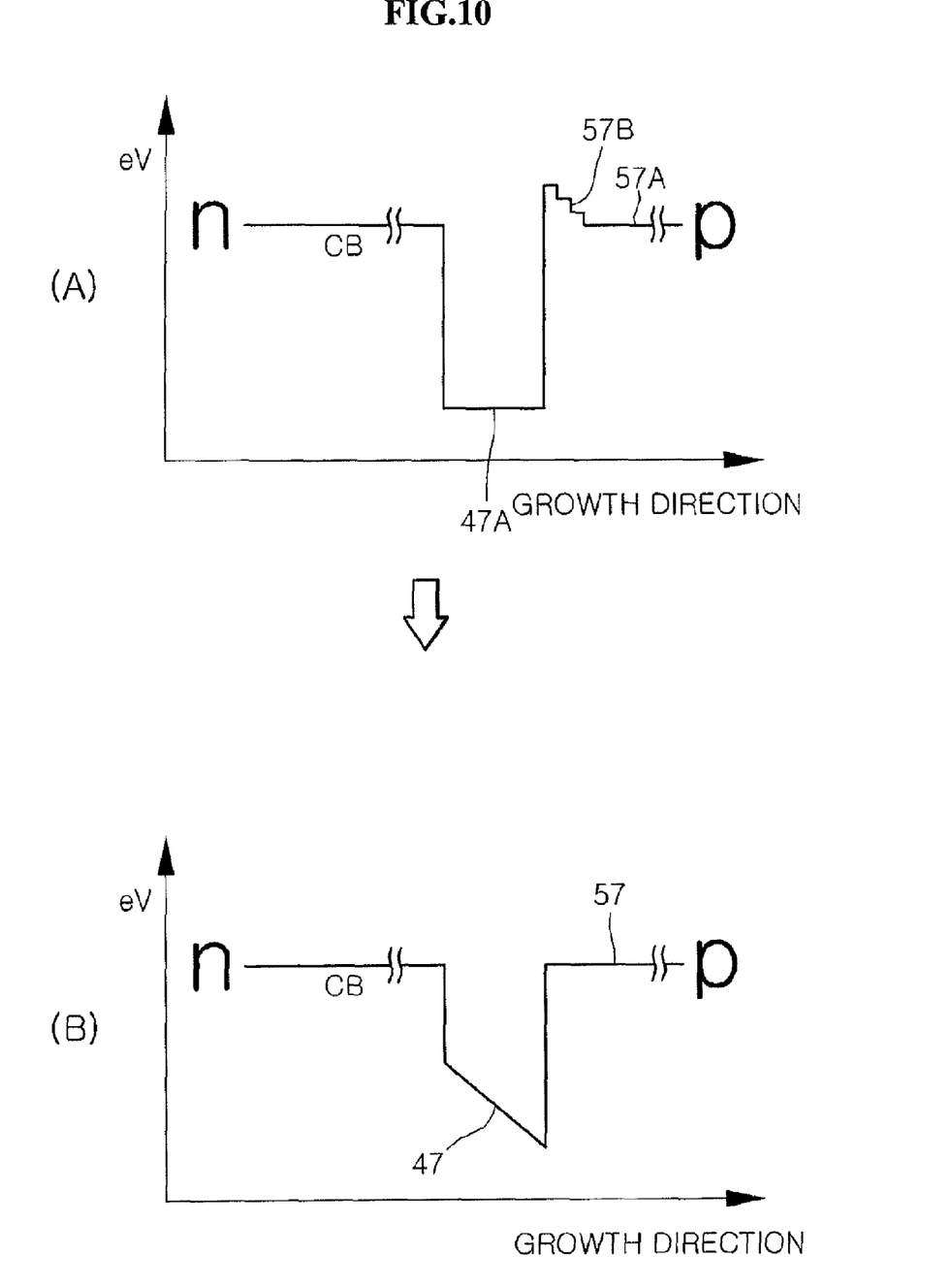
FIG. 10 is an energy band diagram of an active layer according to a ninth embodiment.

FIG. 10 is an energy band diagram of an active layer according to a ninth embodiment. The ninth embodiment will compensate a deformation of an energy band using a quantum barrier layer having a super lattice structure. FIG. 10A is a band diagram of an active layer designed in anticipation of stresses of a quantum barrier layer, and FIG. 10B is a band diagram after growing the active layer designed as illustrated in FIG. 10A.

Referring to FIG. 10A, a quantum barrier layer 57A of an active layer has a super lattice structure 57B. At least one layer or all layers of the quantum barrier layer 57A may have the super lattice structure 57B, but the present disclosure is not limited thereto.

An n-type semiconductor layer side of the quantum barrier layer 57A is grown in the super lattice structure 57B and in one cycle or more, and a p-type semiconductor layer side is grown in the super lattice structure 57B or a normal condition. Here, super lattice structure 57B is grown in a cycle of $Al_cGa_dN/Al_{c1}Ga_{d1}N$ ($0<c\leq1$, $0<c1\leq1$, $d=1-c$, $d1=1-c1$, $c>c1$).

The super lattice structure 57B of the quantum barrier layer 57A may be grown in order of from a material having a large band gap to a material having a small band gap. Here, the material having the large band gap is a material having a high Al content, and the material having the small band gap is a material having low Al content.

Referring to FIG. 10B, an active layer is grown according to the band diagram designed as illustrated in FIG. 10A. In initial growth, a quantum barrier layer 57 of the active layer may be grown in a cycle of an $Al_cGa_dN/Al_{c1}Ga_{d1}N$ super lattice structure and in one cycle or more, and thereafter, may be grown in the normal condition or the above-described super lattice structure. The $Al_cGa_dN/Al_{c1}Ga_{d1}N$ super lattice structure of the quantum barrier layer 57 is grown in order of from the material having the large band gap to the material having the small band gap. That is, the $Al_cGa_dN/Al_{c1}Ga_{d1}N$ super lattice structure is grown in order of $Al_cGa_dN$ having the large band gap and $Al_{c1}Ga_{d1}N$ having the small band gap ($c>c1$).

As a result, the quantum barrier layer 57 can have an approximately flat energy band or the uniform band gap because the deformation of the energy band thereof can be compensated. The deformation of the energy band due to the stress can be prevented or minimized in the quantum barrier layer 57.

Figure 11:
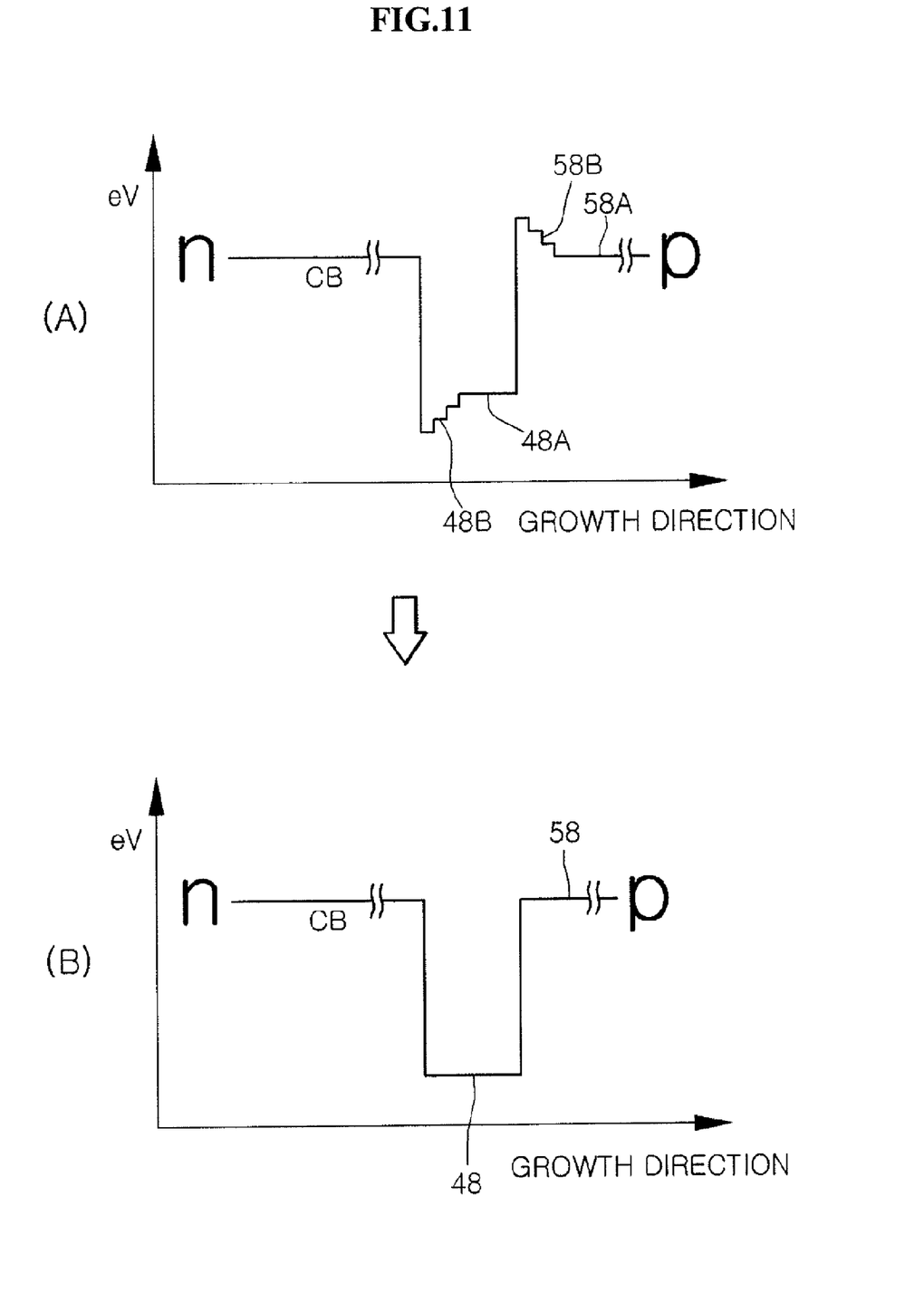
FIG. 11 is an energy band diagram of an active layer according to a tenth embodiment.

FIG. 11 is an energy band diagram of an active layer according to a tenth embodiment. The tenth embodiment will compensate a deformation of an energy band using a quantum well layer and a quantum barrier layer of a super lattice structure. FIG. 11A is a band diagram of an active layer designed in anticipation of stresses of a quantum well layer and a quantum barrier layer, and FIG. 11B is a band diagram after growing the active layer designed as illustrated in FIG. 11A.

Referring to FIG. 11A, a quantum well layer 48A of an active layer may be grown in a first super lattice structure 48B in a partial region or all region. The quantum barrier layer 58A may be grown in a second super lattice structure 58B in a partial region or all regions. The first and second super lattice structures 48B and 58B may be grown in one cycle or more.

The first super lattice structure 48B comprises an $In_aGa_bN/In_{a1}Ga_{b1}N$ super lattice structure, and the second lattice structure 58B comprises an $Al_cGa_dN/Al_{c1}Ga_{d1}N$ super lattice structure.

The first super lattice structure 48B of the quantum well layer 48A is disposed toward an n-type semiconductor layer, and a p-type semiconductor layer side is grown in the first super lattice structure 48B or a normal condition. The second super lattice structure 58B of the quantum barrier layer 58A is disposed toward the n-type semiconductor layer, and the p-type semiconductor side is grown in the second super lattice structure 58B or the normal condition.

The first super lattice structure 48B of the quantum well layer 48A may be grown in order of from a material having a small band gap to a material having a large band gap. The second super lattice structure 58B of the quantum barrier layer 58A may be grown in order of from the material having the large band gap to the material having the small band gap. Here, as an In content increases, the band gap decreases, and as the In content decreases, the band gap increases.

Referring to FIG. 11B, in initial growth, a quantum well layer 48 of the active layer may be grown in a cycle of $In_aGa_bN/In_{a1}Ga_{b1}N$ of the first super lattice structure (See reference numeral 48B of FIG. 11A) and in one cycle or more, and thereafter, may be grown in the normal condition or the first super lattice structure. The $In_aGa_bN/In_{a1}Ga_{b1}N$ super lattice structure of the quantum well layer 48 is grown in order of from the material having the small band gap to the material having the large band gap. That is, the $In_aGa_bN/In_{a1}Ga_{b1}N$ super lattice structure is grown in order of from $In_aGa_bN$ ($0<a1<a\leqq1$) to $In_{a1}Ga_{b1}N$ ($0<a1<a\leqq1$).

In the InGaN quantum well layer 48, a deformation of the energy band of the quantum well layer 48 can be compensated using a characteristic in which a band gap is changed according to the In content.

The quantum well layer 48 can have the approximately flat energy band or the uniform band gap because the deformation of the energy band thereof can be compensated.

Also, in initial growth, a quantum barrier layer 58 of the active layer may be grown in a cycle of $Al_cGa_dN/Al_{c1}Ga_{d1}N$ of the second super lattice structure and in one cycle or more, and thereafter, may be grown in the normal condition or the above-described super lattice structure. The $Al_cGa_dN/Al_{c1}Ga_{d1}N$ super lattice structure of the quantum barrier layer 58 is grown in order of from the material having the large band gap to the material having the small band gap. That is, the $Al_cGa_dN/Al_{c1}Ga_{d1}N$ super lattice structure is grown in order of from $Al_cGa_dN$ ($0\leqq c1<c\leqq1$) having the large band gap to $Al_{c1}Ga_{d1}N$ ($0\leqq c1<c\leqq1$) having the small band gap. Here, in the AlGaN quantum barrier layer 58, the material having the large band gap is a material having a high Al content, and the material having the small band gap is a material having low Al content.

As a result, the quantum barrier layer 58 can have the approximately flat energy band or the uniform band gap because the deformation of the energy band thereof can be compensated. The deformation of the energy band due to the stress can be prevented or minimized in the quantum barrier layer 58.

In the fifth to tenth embodiments, a composition ratio of at least one of In, Al, and Ga is adjusted in at least one layer or all layers of the quantum well layer and/or the quantum barrier layer of the active layer to previously deform the energy band, thereby providing an approximately flat energy band to the quantum well layer and/or the quantum barrier layer even if the energy band deformation occurs due to the stress.

Also, by preventing the piezoelectric field due to the stress from being generated in the active layer, electrons and holes are gathered in a middle of the quantum well to evaluate probability for generation of pairs of electrons and holes, thereby improving the luminous efficiency. In addition, reduction of the internal luminous efficiency can be prevented, and light having a wavelength corresponding to a proper band gap can be emitted.

Although a compound semiconductor light emitting device comprising a N-P junction structure is used in the embodiments, the present disclosure is not limited thereto. For example, a compound semiconductor light emitting device comprising N-P-N, P-N, P-N-P junction structures may be used.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   a first super lattice layer including pairs of at least two semiconductor layers which have compositions different from each other, wherein the pairs of the at least two semiconductor layers are a periodic repeating of the at least two semiconductor layers;
   a first conductive semiconductor layer on the first super lattice layer;
   an active layer on the first conductive semiconductor layer, wherein the active layer includes a single quantum well structure or a multi-quantum well structure having a quantum barrier layer and a quantum well layer on the quantum barrier layer;
   a conductive super lattice layer on the active layer, wherein the conductive super lattice layer includes pairs of at least two semiconductor layers which have compositions different from each other, and the pairs of the at least two semiconductor layers are a periodic repeating of the at least two semiconductor layers; and
   a second conductive semiconductor layer on the conductive super lattice layer.

2. The semiconductor light emitting device as claimed in claim 1, comprising a first buffer layer under the first super lattice layer, wherein the first buffer layer has one of hexagonal, Wurtzite and Zinc blend crystalline structures, and a thickness of the first buffer layer is smaller than a thickness of the first super lattice layer.

3. The semiconductor light emitting device as claimed in claim 1, comprising a substrate under the first super lattice layer.

4. The semiconductor light emitting device as claimed in claim 2, comprising a second buffer layer between the first super lattice layer and the first conductive semiconductor layer,
wherein the second buffer layer has a material composition ratio different from that of the first buffer layer, and a thickness of the second buffer layer is smaller than the thickness of the first super lattice layer.

5. The semiconductor light emitting device as claimed in claim 1, comprising a second super lattice layer on the first super lattice layer; and
a second buffer layer between the first super lattice layer and the second super lattice layer,
wherein the second super lattice layer includes pairs of at least two semiconductor layers which have compositions different from each other, and the pairs of the at least two semiconductor layers are a periodic repeating of the at least two semiconductor layers, and
one layer of each pair of the second super lattice layer has a composition equation of $Al_Y(Ga_XIn_{1-X})_{1-Y}N$ ($0 \leq X \leq 1$, $0 < Y < 0.4$).

6. The semiconductor light emitting device as claimed in claim 1, comprising a second super lattice layer on the first super lattice layer, a first nitride layer between the first super lattice layer and the second super lattice layer, and a second buffer layer between the first nitride layer and the first super lattice layer,
wherein the second super lattice layer has a carrier concentration higher than a carrier concentration of the first super lattice layer.

7. The semiconductor light emitting device as claimed in claim 6, comprising a second nitride layer between the second super lattice layer and the second buffer layer,
wherein a thickness of the second nitride layer is thicker than a thickness of the second buffer layer and a thickness of each layer of the second super lattice layer is thicker than a thickness of each layer of the first super lattice layer.

8. The semiconductor light emitting device as claimed in claim 1, comprising a plurality of buffer layers under the first conductive semiconductor layer, wherein the first super lattice layer is disposed between the plurality of the buffer layers, and each layer of the first super lattice layer has a thickness of about 50 Å to 100 nm.

9. The semiconductor light emitting device as claimed in claim 5, comprising:
a third super lattice layer between the first conductive semiconductor layer and the active layer; and
at least one nitride layer between the third super lattice layer and the active layer,
wherein the third super lattice layer includes at least two semiconductor layers, and one of the at least two semiconductor layers has a composition equation of $Al_Y(Ga_XIn_{1-X})_{1-Y}N$ ($0 \leq X \leq 1$, $0 < Y < 0.25$).

10. The semiconductor light emitting device as claimed in claim 4, wherein one layer of each pair of the first super lattice layer and the conductive super lattice layer has a composition equation of $Al_Y(Ga_XIn_{1-X})_{1-Y}N$ ($0 \leq X, Y \leq 1$).

11. The semiconductor light emitting device as claimed in claim 9, wherein one layer of each pair of the first super lattice layer has a composition equation of $Al_Y(Ga_XIn_{1-X})_{1-Y}N$ ($0 \leq X, Y \leq 1$).

12. The semiconductor light emitting device as claimed in claim 9, wherein each of the first to third super lattice layers comprises one of hexagonal, Wurtzite and Zinc blend crystalline structures.

13. The semiconductor light emitting device as claimed in claim 1, wherein at least one quantum well layer of the active layer has a composition ratio of $In_a$ reduced step by step in a range of $0 < a \leq 1$.

14. The semiconductor light emitting device as claimed in claim 1, wherein at least one quantum barrier layer of the active layer has a composition ratio of $Al_c$ reduced step by step in a range of $0 < c \leq 1$.

15. The semiconductor light emitting device as claimed in claim 6, wherein the first nitride layer has a thickness of 0.001 μm to 3 μm and has the carrier concentration of about $10^{15}$ cm$^3$ to $10^{20}$/cm$^3$.

16. The semiconductor light emitting device as claimed in claim 6, wherein each layer of the second super lattice layer has a thickness of about 10 Å to 500 μm and is an n-type semiconductor layer.

17. The semiconductor light emitting device as claimed in claim 6, wherein the second buffer layer has a thickness of 0.0001 μm to 0.1 μm.

18. The semiconductor light emitting device as claimed in claim 1, comprising at least two n-type layers disposed between the first super lattice layer and the first conductive semiconductor layer.

19. The semiconductor light emitting device as claimed in claim 1, comprising:
a first nitride layer disposed between the first super lattice layer and the first conductive semiconductor layer; and
a second super lattice layer disposed between the first nitride layer and the first conductive semiconductor layer,
wherein the first super lattice layer, the first nitride layer, and the second super lattice layer are an n-type semiconductor, and
the first super lattice layer has a carrier concentration of about $10^{16}$/cm$^3$ to $5 \times 10^{18}$/cm$^3$, the first nitride layer has a carrier concentration of about $10^{15}$/cm$^3$ to $10^{20}$/cm$^3$, and the second super lattice layer has a carrier concentration of about $10^{17}$/cm$^3$ to $8 \times 10^{20}$/cm$^3$.

20. The semiconductor light emitting device as claimed in claim 18, wherein the conductive super lattice layer and the second conductive semiconductor layer are each a p-type semiconductor layer, and a carrier concentration of the conductive super lattice layer is higher than a carrier concentration of the second conductive semiconductor layer.

* * * * *